United States Patent [19]
He et al.

[11] Patent Number: 5,933,106
[45] Date of Patent: Aug. 3, 1999

[54] ENCODER SIGNAL ANALYSIS SYSTEM FOR HIGH-RESOLUTION POSITION MEASUREMENT

[75] Inventors: Gang He; Harry A. Atwater, both of Pasadena, Calif.

[73] Assignee: California Institute of Technology, Pasadena, Calif.

[21] Appl. No.: 08/890,741

[22] Filed: Jul. 11, 1997

[51] Int. Cl.⁶ .................................................. H03M 5/22
[52] U.S. Cl. ........................................... 341/116; 341/155
[58] Field of Search ................................. 341/116, 155, 341/111, 118, 112

[56] References Cited

U.S. PATENT DOCUMENTS

5,365,184  11/1994  Callender et al. .......................... 327/2
5,442,172  8/1995  Chiang et al. ........................... 250/237

*Primary Examiner*—Marc S. Hoff
*Assistant Examiner*—Peguy JeanPierre
*Attorney, Agent, or Firm*—Fish & Richardson P.C.

[57] ABSTRACT

A signal analysis system for processing quadrature analog waveforms from an encoder. High-resolution position measurements for external measurement devices are obtained. A hardware component receives the quadrature analog signals from the encoder and processes these signals to generate low and high-resolution waveforms. These waveforms are then further processed and sent as first and second data streams to a computational component of the signal analysis system. The absolute phase angle ($\Theta$) of the encoder's analog signal is determined by processing the data streams with the computational component. $\Theta$ is compared to a series of calibration factors to determine the position of the translating component of the external measurement device.

17 Claims, 5 Drawing Sheets

ENCODER SIGNAL ANALYSIS SYSTEM FOR HIGH-RESOLUTION POSITION MEASUREMENT

STATEMENT OF FEDERALLY SPONSORED RESEARCH

The U.S. government may have certain rights in this invention pursuant to grant number DMR-89558070 awarded to the Applicants by the National Science Foundation.

FIELD OF THE INVENTION

This invention relates to an improved position-measuring system. More specifically the present invention describes an improved rotary encoder.

BACKGROUND AND SUMMARY

Position encoders accurately measure linear and angular displacements of external measurement devices such as x-ray diffractometers, optical spectrometers, and micropositioners. Typical encoders include a position-measuring component, such as a rotating shaft, connected to the external measurement device. The shaft is rotated as the measurement device is adjusted. The encoder, in response, generates one or more analog electrical signals correlated to the degree of rotation. These signals are then processed by an external processing element to determine the position of the measurement device.

High-resolution encoders, such as the Cannon K1 encoder, typically include an optical element for generating the analog electrical signals. For example, Cannon's encoder includes a diode laser and a miniaturized optical system connected to the rotating shaft. The optical system modulates the intensity of the diode laser's optical output as the shaft is rotated. The modulation results in a series of sinusoidal oscillations or "pulses" in the optical output. The number of oscillations or pulses is related to the degree to which the shaft is rotated. The modulated optical output is detected with a pair of light-sensitive diodes housed within the encoder. These diodes generate electrical analog signals in response to the modulated optical output.

The K1 encoder is configured to generate quadrature analog electrical signals. These signals, Signals A and B, are sinusoidally modulated at frequencies up to 500 kHz and are separated in phase by 90°. Typically, signals A and B include 81,000 sinusoidal pulses for each 360° revolution of the rotating shaft (Cannon K-1 Encoder and CI40-2 Circuit Specification Sheet, 1994).

Analog signals from the K1 encoder are processed by an external interpolation circuit to measure position. This circuit makes a low-resolution measurement based on a counting of the number of sinusoidal pulses from the encoder. Finer position measurements are obtained from the phase of the signals.

The Cannon Encoder CI40-2 Interpolator is an example of such a circuit. This circuit can be interfaced with the K1 encoder. In a typical application, the circuit divides a single analog sinusoidal pulse from the encoder into 40 square pulses. Each square pulse is then counted by an external device, such as a computer, to determine the position of the external measurement device.

The CI40-2 and other similar interpolation circuits are susceptible to several types of errors which may degrade their ability to accurately measure position. For example, these circuits may generate electrical pulse trains in response to high frequency noises such as radio signals. The noise-induced pulse train may be mixed with the digital output from the circuit, causing the computer to loose track of the encoder's position. In addition, the circuit may yield inaccurate position measurements if the input signals, Signals A and B, are not perfectly quadrature i.e., they are phase-shifted by greater or less than 90°. These systems, therefore, are unable to make high-resolution position measurements. Conventional circuits are typically expensive and can only be used with a single encoder at any one time.

Another problem comes from any lack of synchronization between the stages. If the phase value from the high precision stage has a low absolute value (e.g., <5° or <175°), mis-synchronization between the stages can cause the reading to be a whole quadrant off.

To overcome these and other limitations, Applicants' invention provides a signal analysis system for processing signals from an encoder to provide high-resolution position measurements. The system includes a hardware component for converting analog input signals into digital waveforms. The hardware component is coupled to a computational component which determines the phase values of the digital waveforms and compensates for input signals which are non-quadrature or have other errors. The phase value, in turn, is analyzed to make a position measurement. By combining the hardware and computational components in this way, the system can rapidly interpret encoder signals to make position measurements with high resolution and accuracy.

Moreover, the system minimizes the effects of high-frequency background noise which can interfere with the process of counting the square pulses.

A feature of the invention is a special technique that limits the operation in a way that avoids misalignment errors caused by separate operating stages. This can preferably be done in software, minimizing any incremental cost. The signal analysis system may be used with a variety of encoder systems.

Preferred embodiments include a hardware component for receiving the analog signals from the encoder. The hardware component digitizes these signals to generate low and high-resolution waveforms. These waveforms are then further processed and sent as first and second data streams to the computational component of the signal analysis system. The first data stream includes an integer value representing the total number of sinusoidal pulses in the analog signal. The second data stream includes a pair of digitized quadrature (or non-quadrature) signals.

A position measurement having high and low-resolution components is made by processing the data streams with the computational component to determine the absolute phase angle ($\Theta$) of one of the encoder's analog signals. A low-resolution component of $\Theta$ is related to the integer number of sinusoidal pulses in the analog signals. A high-resolution component is determined by measuring the final phase angle $\Theta'$ corresponding to the final sinusoidal pulse. Thus, the low-resolution component of $\Theta$ is an integer multiple of $2\pi$ and the high-resolution component has a value between 0 and $2\pi$. The absolute phase angle $\Theta$ is the sum of these components. Once determined, $\Theta$ is compared to a series of calibration factors to determine the position of the external measurement device.

The hardware component includes two analog-to-digital (A/D) stages for processing the encoder's quadrature signals. Low-resolution A/D conversions are preferably made in the first stage with a comparator. The comparator processes the analog signals to generate a single digitized square waveform containing a series of square pulses. The square pulses are then counted using, for example, a quadrature up/down counter to determine the integer number of sinusoidal pulses. High-resolution A/D conversions are made with an N-bit A/D converter to generate a digital sinusoidal waveform for each quadrature analog signal. The resolution of the waveform is determined by the value of N. The hardware component additionally includes an amplifying/filtering circuit for processing the analog signals prior to digitization. This circuit further increases the performance of both the high and low-resolution stages.

The first and second data streams generated by the hardware component are sent to the computational component for processing. In a preferred embodiment, the computational component mathematically represents the data in the data streams as a two-dimensional vector bound at one end to the origin of a two-dimensional space. The number of times the vector circles the origin is related to the first data stream (i.e., the integer number of sinusoidal pulses). The position of the vector within its final rotation is related to the second data stream (i.e., the phase of the final sinusoidal pulse). Further mathematical steps may be employed to account for analog signals from the encoder which are non-quadrature. An additional step may be used to ensure that the first and second data streams are synchronized. Once determined, the absolute phase angle can be determined and used to make the position measurement.

These and other advantages will be apparent from the following detailed description, and from the claims.

DETAILED DESCRIPTION

The signal analysis system according to the invention includes a hardware component for converting analog input signals into digital waveforms. The hardware component is coupled to a computational component which determines the phase values of the digital waveforms to make a position measurement. The computational component additionally compensates for input signals which are non-quadrature or have other errors. This system rapidly interprets encoder signals to make position measurements with high resolution and accuracy in a way which facilitates accuracy.

Figure 1:
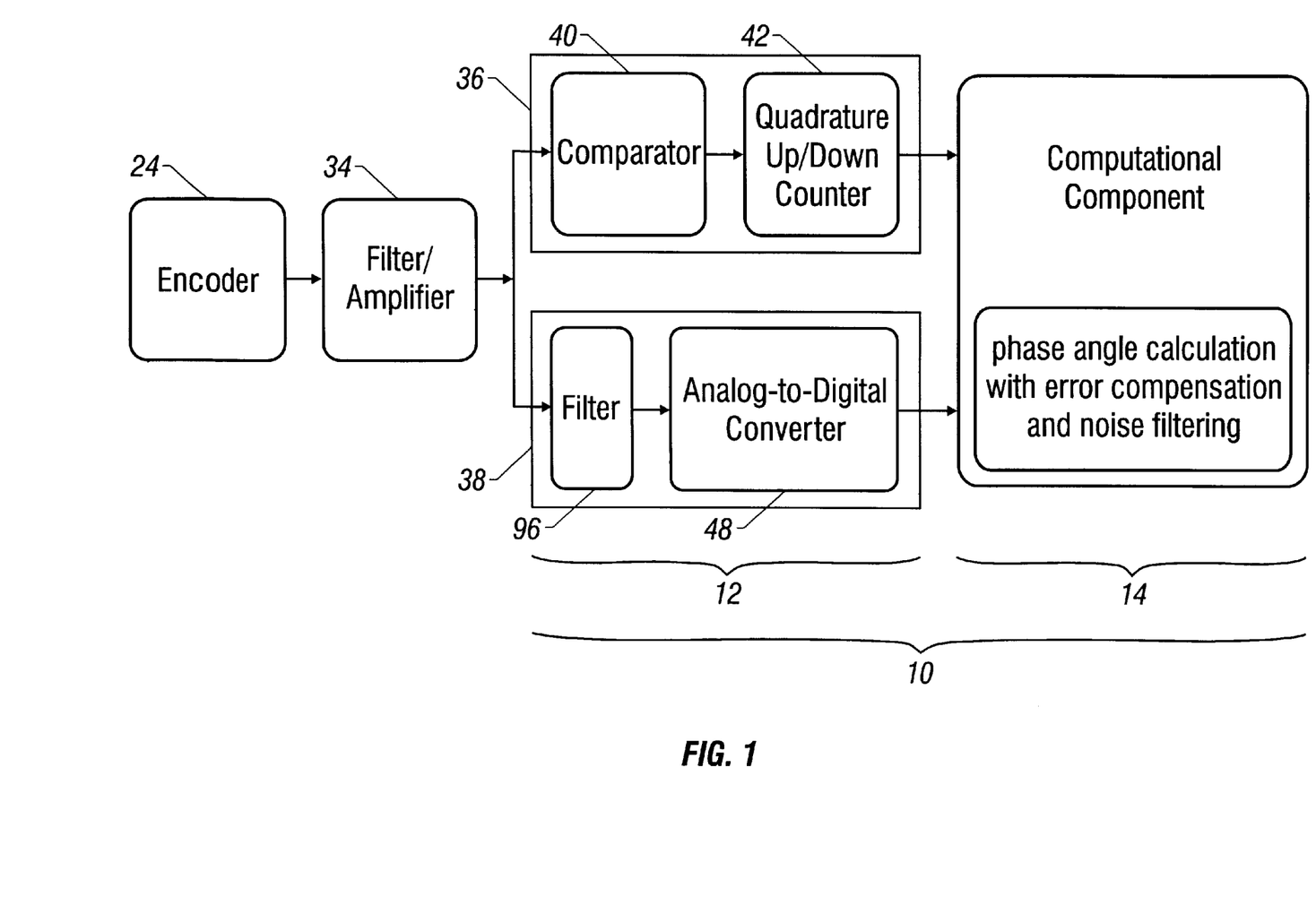
FIG. 1 is a block diagram illustrating the hardware and computational components of the signal analysis system.

FIG. 1 shows a block diagram illustrating the functions performed by the hardware 12 and computational 14 components of a preferred signal analysis system 10. Signals are generated by an encoder 24 during a position-measuring process. This encoder is a standard part; and the signals are usually quadranturesine waves. The signals are amplified and filtered by circuit 34 to change the signal to improve its characteristics.

The amplified analog signals are connected to both low-resolution stage 36 and high-resolution stage 38 which generate, respectively, high and low-resolution digital waveforms.

The low-resolution stage 36 uses comparator 40 for coarse A/D conversion of the input signal. A predetermined output voltage is generated by the comparator when the input voltages of the analog signals satisfy predetermined amplitude requirements. In a preferred embodiment, the comparator is a Schmidt comparator. Quadrature up/down counter 42 counts the squared pulses from comparator 40. Counter 42 returns a first data stream indicating an integer number N of sinusoidal pulses in the encoder's analog signals. This output has low resolution, and is quantized to the resolution of the resolution of the integer pulses. A single sinusoidal period, for example, may be represented by the integer "2". The first data stream is then directed to the computational component 14 of the signal analysis system 10 for processing.

An A/D converter 48 in combination with a filtering circuit 46 digitizes the analog signals in the high-resolution stage 38. Here, the filtering circuit 46 is used to remove high noise from the input analog quadrature signals. The filter is a low pass filter. High frequency noise is more likely to radiatively couple into the system. Low frequency noise is not removed by the filter because signal is also at low frequency. However, they can be removed later in the software by digital averaging. The filtered output is then directed to the A/D converter 48 for digitization. The digitized waveforms are sent in a second data stream to the computational component 14 for processing.

The computational component determines the total phase angle and the phase shift of the input analog signals. The total phase angle is processed to make a position measurement, while the phase shift is analyzed so that non-quadrature signals can be compensated.

Figure 2:
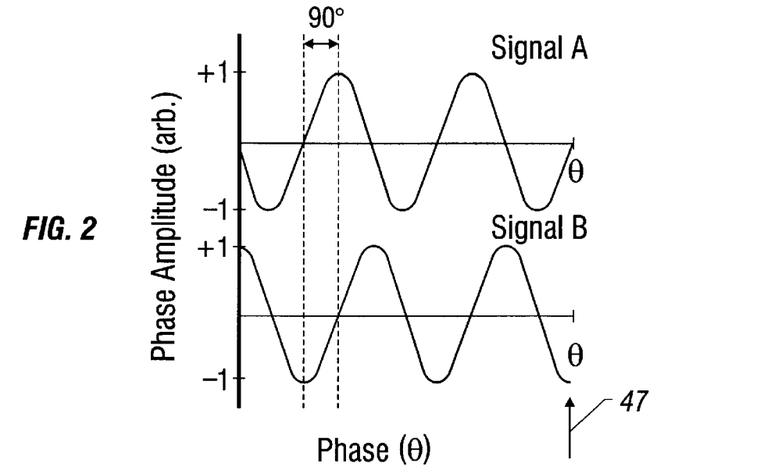
FIG. 2 is a plot of phase amplitude as a function of phase angle for a pair of quadrature analog signals (Signals A and B) from an encoder.

FIG. 2 illustrates the total phase angle and phase shift in a pair of quadrature analog signals (Signal A and Signal B) from the encoder. These signals each include a series of sinusoidal pulses. The phase value at the endpoint of the final pulse (indicated by the arrow 47) corresponds to the total phase angle Θ. Thus, at Θ, the phase amplitude of Signal A is zero while the phase amplitude of Signal B is (−1). The pair of dashed lines in the figure indicate the phase shift between Signals A and B, the phase shift shown is 90°.

Figure 3A:
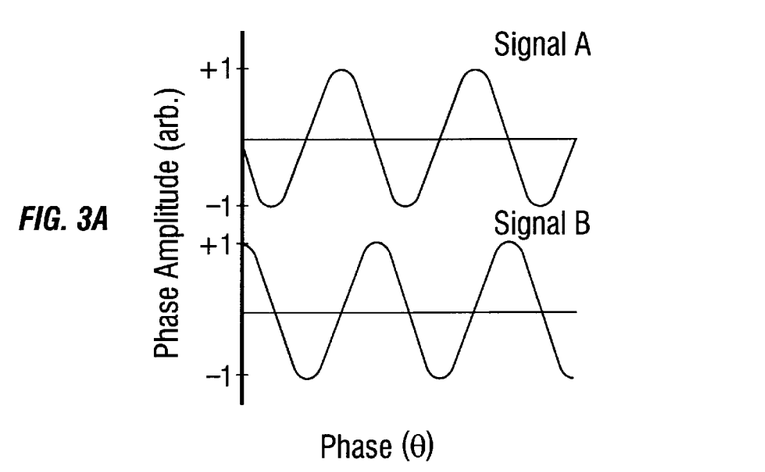
FIGS. 3A and 3B are, respectively, digitized high-resolution quadrature sinusoidal waveforms and a digitized high-resolution square waveform generated with the hardware component.
Figure 3B:
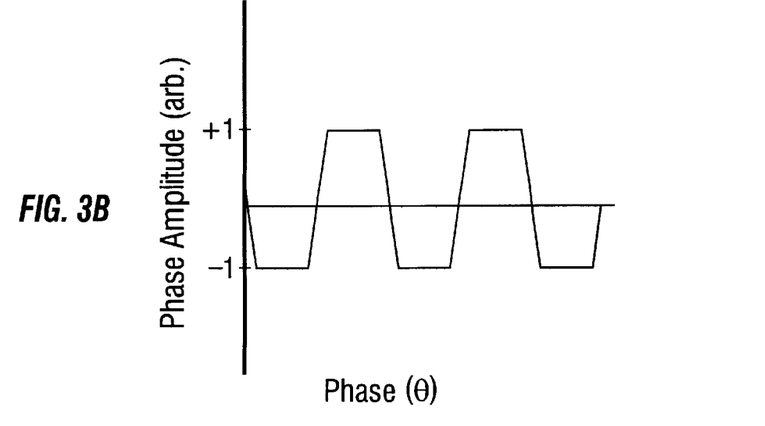

The digitized waveforms generated by the high and low-resolution stages in response to the quadrature analog signals are shown in FIGS. 3A and 3B. The low-resolution waveform (FIG. 3B) generated by the comparator 40 is a series of electrical squared pulses formed from Signals A and B. Each square pulse represents one half of a period of the input sinusoidal signals. The high-resolution waveforms (FIG. 3A) retain the sinusoidal features of the input analog signals.

Figure 4:
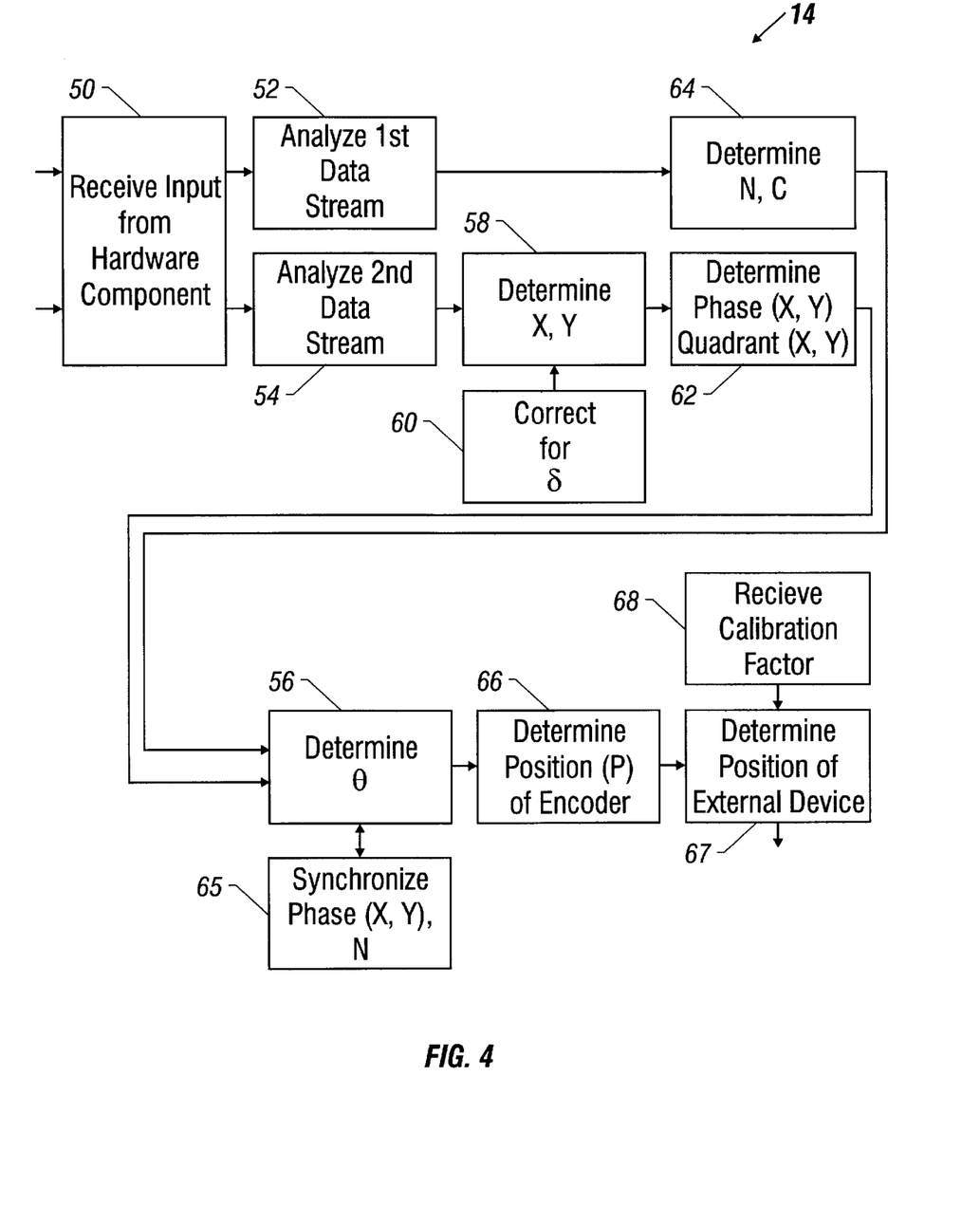
FIG. 4 is a block diagram illustrating the steps performed with the computational component of the signal analysis system.

FIG. 4 shows a block diagram illustrating the processing of the data by the computational component 14. To process the data streams generated by the hardware component. First (low resolution) and second (high resolution) data streams are received at step 50. The streams are respectively analyzed at steps 52 and 54 to determine parameters that are used by the process to eventually determine the total phase angle Θ at step 56.

The second data stream from step 54 includes two digitized sinusoidal waveforms which are phase shifted relative to one another by π/2 (90°) when the encoder generates perfect quadrature signals. The actual position of the encoder is proportional to the phase angle (θ) between the signals. If the encoders were perfect there would be a perfect π/2 shift between the signals, and tan θ would equal B/A (where A and B are the two encoder signals. In reality, however, there is a δ phase shift, so the signals really can be described as:

$$A = COS\ (\theta - \delta/2) \quad (1)$$

$$B = SIN\ (\theta + \delta/2) \quad (2)$$

This can lead to errors in values, especially values nearing quadrant boundary.

In principle, however, the real phase shift between Signals A and B is π/2+δ, where δ is a phase shift error. The magnitude of δ is primarily determined by the optical and electrical components of the encoder. Typically, δ has a constant value specific to a particular encoder. This value is determined by calibrating the encoder prior to performing a measurement. The calibration valve is stored in the memory of the computational component. δ is then used to compensate for non-quadrature analog signals from the encoder.

The second data stream is transformed (step 58) to a vector (X,Y) by the computational component. Correction (step 60) of the vector for δ is carried out by first expressing Signals A and B as:

$$\text{Signal}\ A = \cos\ (\theta' - \delta/2) = A \quad (1)$$

$$\text{Signal}\ B = \sin\ (\theta' + \delta/2) = B \quad (2)$$

The signals can be rewritten as the vector (X,Y) in a two-dimensional space as:

$$X = \cos(\theta') = \left[A\cos\left(\frac{\delta}{2}\right) - B\sin\left(\frac{\delta}{2}\right)\right]\cos(\delta) \quad (3)$$

$$Y = \sin(\theta') = \left[B\cos\left(\frac{\delta}{2}\right) - A\sin\left(\frac{\delta}{2}\right)\right]\cos(\delta) \quad (4)$$

δ is a calibrated parameter of a specific encoder system. X, Y is essentially a vector in 2-D space. The encoder need to count the number of times that X, Y has circled the origin. The present invention defines C as the count of cycles of X,Y around the origin, and N as the count of quadrants that are passed by the X,Y vector 80 counterclockwise being positive). This vector 80 and Θ' are plotted in the polar diagram 82 shown in FIG. 5.

The contribution from the first data stream to the total phase angle Θ is determined at step 62 by calculating the values of the functions phase(X,Y) and quadrant(X,Y). Phase(X,Y) is defined as the angular displacement of the vector 80 from 0°. This displacement is indicated by the line 84 in the polar diagram 82 of FIG. 5. Phase(X,Y) returns a value between 0 and 2π by calculating arctan (Y/X) using equations 3 and 4 above. Quadrant(X,Y) returns a value indicating the current quadrant. The values returned by quadrant(X,Y) for ranges of phase(X,Y) are preferably.

Figure 5:
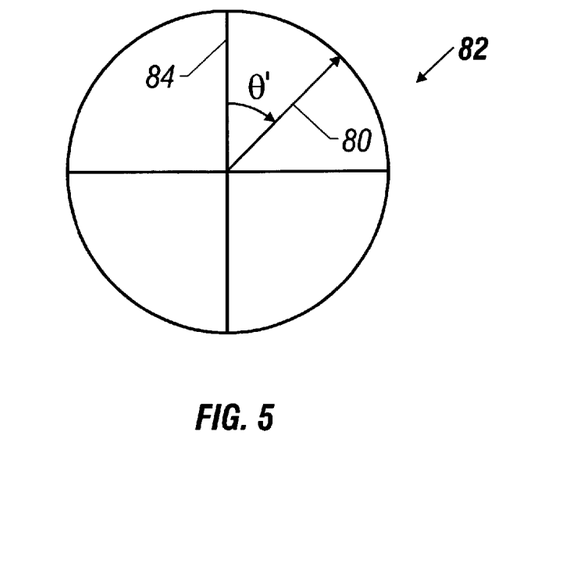
FIG. 5 is a polar plot wherein the first and second data streams from the hardware component are represented vectorially.

| quadrant(X, Y) | phase(X, Y) |
|---|---|
| 0 | between 0 and π/2 |
| 1 | between π/2 and π |
| 2 | between n and 3π/2 |
| 3 | between 3π/2 and 2π |

The first data stream at 52 coarsely indicatreds an integer related to the number of sinusoidal pulses in Signals A and B. The integer indicates the number of times that the vector 80 is rotated around the origin of the polar plot 82. This integer allows the different values to be differentiated from one another. Phase(X,Y) is a periodic quantity and the same value is returned for an angle α, α+2π, α+4π, etc. without the integer, phase(X,Y) could not be used alone to calculate Θ.

The values C and N are determined at step 64 as follows: N is defined as an integer representing the number of quadrants through which the vector has passed. N is obtained by counting the A,B quadrature signals in the standard way that encoder output signals are counted. The present invention uses Schmidt comparators to change the quadrature sine value to a square wave.

The total phase angle Θ are used to determine the value at (step 56) using $$\begin{aligned}\theta &= 2\pi C + \text{phase}(X, Y) \quad (5)\\ &= C \cdot 2\pi + \text{quadrant}(X, Y) \cdot \pi/2 + \text{phase}(X, Y) - \\ &\quad \text{quadrant}(X, Y) \cdot \pi/2 \\ &= [C \cdot 4 + \text{quadrant}(X, Y)] \cdot \pi/2 + \\ &\quad [\text{phase}(X, Y) - \text{quadrant}(X, Y) \cdot \pi/2] \\ &= N \cdot \pi/2 + [\text{phase}(X, Y) - \text{quadrant}(X, Y) \cdot \pi/2]\end{aligned}$$

or, equivalently:

$$\theta = \frac{N\pi}{2} + \left[\text{phase}(X, Y) - \frac{\pi\,\text{quadrant}(X, Y)}{2}\right] \quad (6)$$

Note that eq(6) requires only N, Phase, and quadrant. These quantities can be directly measured from the hardware, thus simplifying the process. N is available from all encoders and is obtained at step 64 above. Phase can be obtained from 3 and 4. Quadrant (X,Y) is calculated from N as Quadrant (X,Y)=(N mod 4), assuming that N started counting at quadrant θ.

Perfect synchronization between the integer values of the low-resolution waveform (used to generate C and N) and the digitized sinusoidal waveforms from the high-resolution waveform (used to generate phase(X,Y) and quadrant(X,Y)) is not guaranteed. In fact, phase (X,Y) may be one quadrant away from the quadrature center N because the first and second data streams are generated using separate stages in the hardware component.

The present invention solves this problem by restricting phase(X,Y) at step 65 to a (−π, +π) range from the center of the quadrant indicated by the quadrature counter N, i.e. This restriction can be expressed using the relationship:

$$-\pi < \text{phase}(X, Y) - \left[(N \bmod 4)\frac{\pi}{2} + \frac{\pi}{4}\right] < +\pi \quad (7)$$

Equation 7 can then be combined with equation 6 to express the total phase angle Θ as:

$$\Theta = N \cdot \pi/2 + [\text{phase}(X, Y) - \text{quandrant}(X, Y) \cdot \pi/2] \quad (8)$$
$$= N \cdot \pi/2 + \pi/4 + [\text{phase}(X, Y) - (\text{quandrant}(X, Y) \cdot \pi/2 + \pi/4)]$$

$$\theta = \frac{2N}{\pi} + \frac{\pi}{4} + \text{offset}\left(\text{phase}(X, Y) = \left[\frac{\pi(N \bmod 4)}{2} + \frac{\pi}{4}\right]\right)$$

where offset($\alpha$) is a function which folds an angle $\alpha$ into the range of ($-\pi$, $+\pi$):

$$\text{offset}(\alpha) = \alpha - 2\pi \text{closest} \cdot \text{integer}\left(\frac{\alpha}{2\pi}\right) \quad (9)$$

and closest.integer is a function that returns the closest integer to the value in parent.

The final position p of the encoder is calculated at step 66 from the total phase angle $\Theta$ and the encoder displacement L per sinusoidal output cycle:

$$p = \frac{L\theta}{2\pi} \quad (10)$$

A calibration factor $\delta$ relating the encoder position p and the position of the external measuring device is determined prior to performing the above series of calculations. The calibration factor is determined by first adjusting the position of the external measuring device by a known distance, and then measuring the corresponding positional change of the encoder. The calibration factor is stored in memory and retrieved (step 68) and used in combination with equation 10 to determine (step 70) the final position of the external measuring device. In some cases, the factory pre-calibration is so good that no user calibration is needed.

The analog quadrature signals from the encoder are amplified and filtered before being digitized and sent to the computational component for processing.

Figure 6:
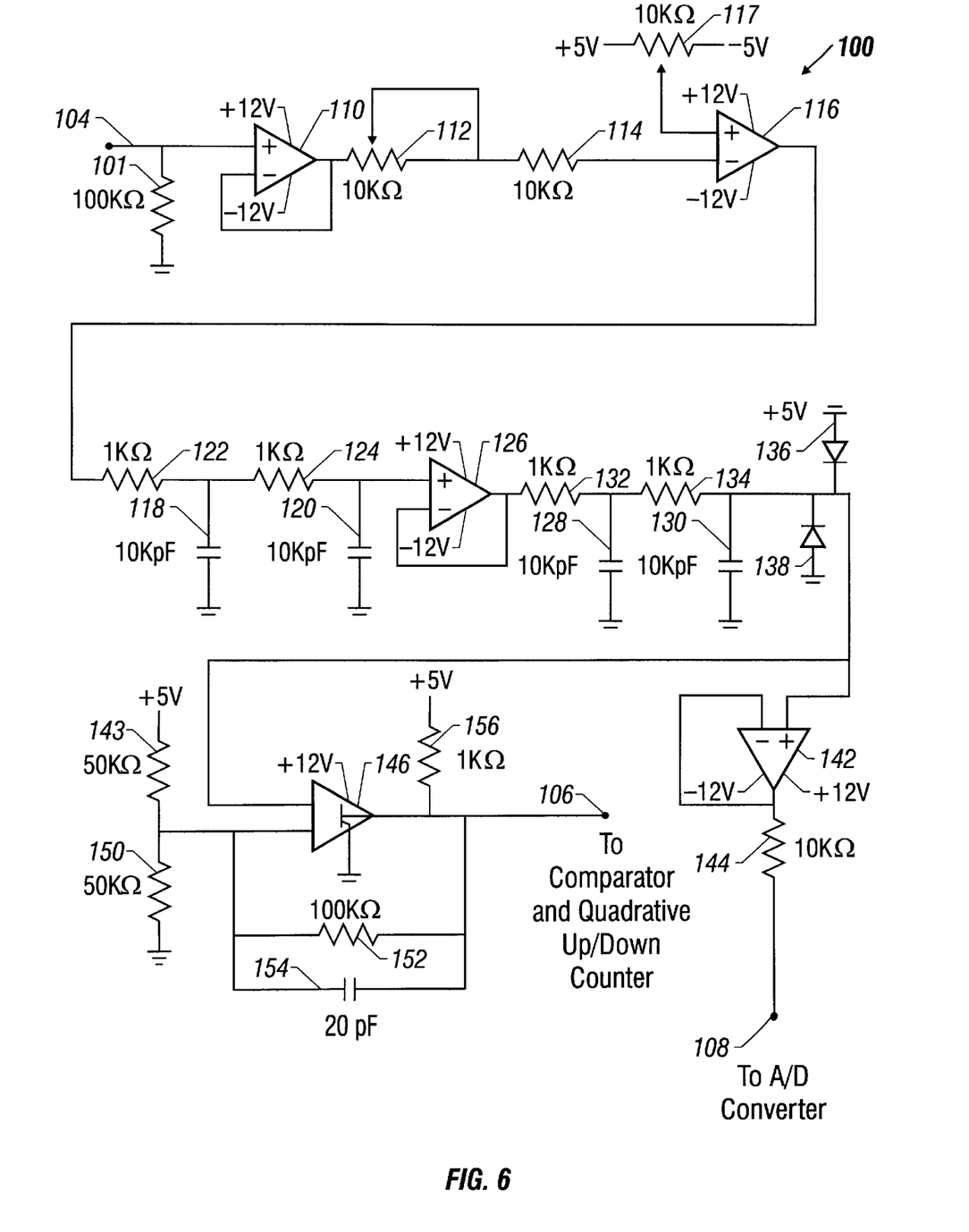
FIG. 6 is a circuit diagram illustrating an amplifying/filtering circuit of the hardware component.

FIG. 6 shows an amplifying/filtering circuit 100 included in the hardware component of the signal analysis system. The circuit 100 prepares input quadrature analog signals for further digitization in the low and high-resolution stages. Analog Signals A and B from the encoder are received by the circuit at an input lead 104. The waveforms are then sent via output leads 106, 108 to, respectively, the comparator and A/D converter (not shown in the figure) for low and high-resolution digitization.

The circuit 100 is impedance-matched to the encoder using a 100 KΩ resistor 101. After passing through the input lead 104, Signals A and B are amplified using an amplifier 110 and a potentiometer 112 (serving as a gain adjustment). The signals then pass through an in-series resistor 114 prior to entering an amplifier 116. A resistor 117 provides a gain offset by adjustably biasing the amplifier 116 with voltages of +5V and −5V. Once amplified, Signals A and B pass through a filtering stage of the circuit which features a pair of grounded 10 kpF capacitors 118, 120 connected in series to a pair of 1 KΩ resistors 122, 124. The signals are then amplified with an amplifier 126 and further filtered with an additional pair of grounded capacitors 128, 130 and in-series resistors 132, 134. The filtered signals pass through a pair of diodes 136, 138 which prevent reverse biasing of the analog signals and then enter the junction 140.

Signals A and B are split at junction 140 into first and second portions. The first portions are amplified with an amplifier 142 prior to passing through a final resistor 144 and output lead 108. The signals are then received by the A/D converter, digitized, and sent as a pair of sinusoidal waveforms in the second data stream to the computational component of the signal analysis system. The second portions of the signals split at the junction 140 are received by an amplifier 146. Here, the gain offset is provided by a pair of 50 kΩ resistors 148, 150 connected to a 5V load. A resistor 152 and capacitor 154 are connected in parallel to an amplifier 146 to further filter the signals. The signals pass through the output lead 106 and are received by the comparator. The comparator digitizes the signals to form a single square waveform featuring a series of square pulses. A 1 kΩ resistor 156 is used to impedance-match the circuit to the comparator. The square waveform is then processed with the quadrature up/down counter, with the returned integer value of square pulses sent in the first data stream to the computational component.

Any type of comparator or A/D convertor may be used for digitization at, respectively, the low and high-resolution stages. In general, preferred A/D converters and comparators can process analog signals having the properties listed in Table 2, below.

TABLE 2

| Requirements for Analog Signals[1] | | |
|---|---|---|
| Property | A/D Converter | Comparator |
| Frequency | Highest frequency at which accurate position measurement is resolved | Frequency of quadrative signal at maximum notion (rotation) speed |
| Input Voltage | match quadrative speed | match quadrative signal with hystesesis for noise margin |
| Input Current | impedance match to quadrative signals | impedance match to quadrative signals |

The resolution of the A/D conversion at the high-resolution stage is determined by the dynamic range of the A/D converter. For example, using an N-bit A/D converter, the maximum signal amplitude is $2^N - 1$ and the worst-case conversion error is $2^{-\frac{1}{2}}$. Thus, the worst-case phase error measured with the signal analysis system is:

$$\Delta\theta = \frac{2^{1/2}}{2^{n-1}} = 2^{-(n-3/2)} \quad (11)$$

The maximum resolution of the converter, i.e., the number of divisions in the waveform per sinusoidal cycle, is:

$$D = \frac{2\pi}{\Delta\theta} \sim 2.22 \cdot 2^n \quad (12)$$

For example, using an 8-bit A/D converter the maximum resolution of the digitized waveform will be $2.22 \times 2^8$, or 560 divisions, per each sinusoidal cycle.

Figure 7:
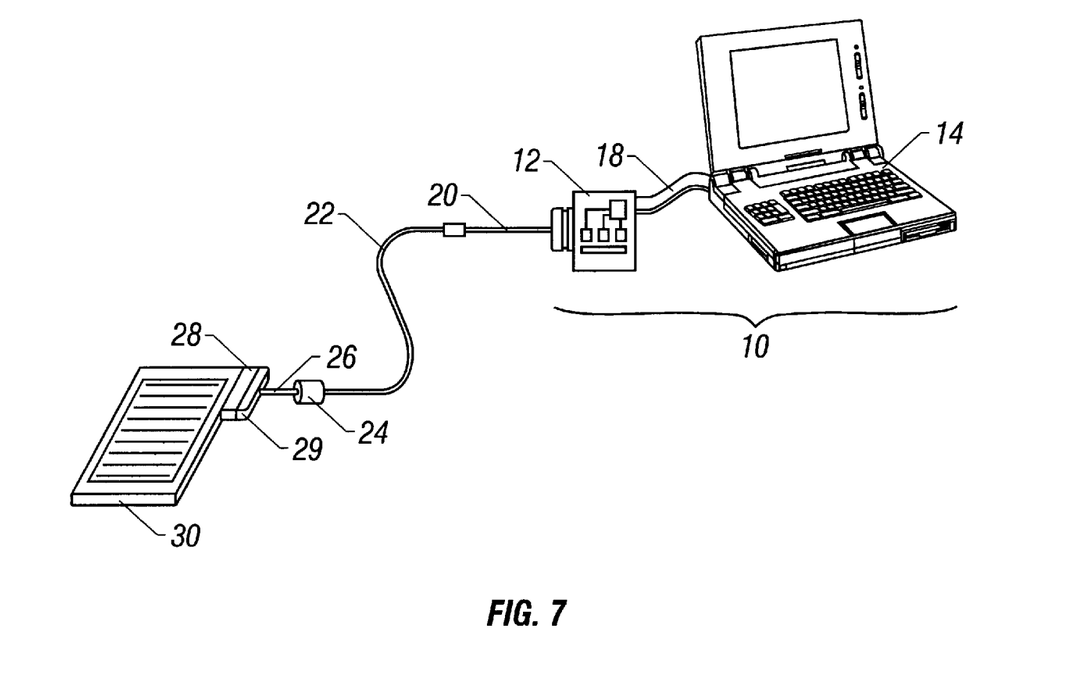
FIG. 7 is a plan view of the signal analysis system of the invention used in combination with a motor-driven translational stage and a computer.

FIG. 7 shows a signal analysis system 10 used in combination with a position encoder 24. The hardware component 12 is a printed circuit board. The computational component 14 is a computer connected to the hardware component by a ribbon cable 18. A connector 20 and conductive cable 22 additionally connect the hardware component 12 to the encoder 24. The encoder 24 includes a rotating shaft 26 serving as a position-measuring component. The shaft 26 is mechanically connected by a gearing apparatus 29 to a motor-driven micrometer 28. The micrometer is driven by separate means to actuate movement in a translational stage 30.

During a measurement process the micrometer is adjusted to move the gearing apparatus 29. This movement causes the encoder's rotating shaft 26 to rotate. Rotation of the shaft modulates a pair of quadrature optical signals generated inside the encoder. The modulated optical signals are detected with a pair of light-sensitive which generate a pair of electrical quadrature analog signals in response to the optical signals.

The quadrature analog waveforms are delivered via the conductive cable 22 to the hardware component 12 of the signal analysis system 10. The received analog signals are processed by the high-resolution and low resolution stages to generate, respectively, digital sinusoidal and square waveforms. Both square and sinusoidal waveforms are further processed by the hardware component to yield the first and second data streams. These streams are then delivered via the ribbon cable 18 to the computational component 14 for processing and determination of the total phase angle $\Theta$. This quantity is then related to the degree of rotation of the rotating shaft 26. The degree of rotation is related to the position of the motor-driven micrometer 28 to give the position of the translational stage 30.

OTHER EMBODIMENTS

Other embodiments are within the scope of the invention. For example, while a preferred amplifying/filtering circuit is shown in FIG. 6, it is understood that alternate circuits may also be used. In general, circuits generating waveforms having the properties listed in Table 2 may be used with conventional A/D converters and comparators. These circuits may be included in the hardware component of the invention. In addition, the amplifying/filtering circuit may be modified to connect multiple encoders. In such systems, separate comparators and quadrature up/down counters are needed for each encoder. However, only one computational component and A/D converter (as described above) are required for digitization and analysis.

Additional embodiments of the invention are within the scope of the following claims:

What is claimed is:

1. A signal analysis system for processing output signals from an encoder comprising:

a lower-resolution stage including a waveform processing element producing a processed signal, and a counter which counts an aspect of the processed signal to generate an integer value indicating information therefrom, a low-resolution analog-to-digital converter operating to digitize first portions of the output signals to form digital waveforms;

a higher-resolution stage, coupled to said lower-resolution stage, and including a high-resolution analog-to-digital converter for digitizing second portions of the output signals to form a pair of digital sinusoidal waveforms; and, a computational component, responsive to the pair of digital sinusoidal waveforms from said higher-resolution stage and the integer value from said counter for calculating a position of the encoder, the computational component including a processor comprising:

first calculating means for calculating a first phase value from the integer value;

second calculating means for calculating a second phase value from a portion of one of the digital sinusoidal waveforms; and, adding means for adding the first and second phase values to determine a total phase value.

2. The signal analysis system of claim 1, wherein said second calculating means includes an error compensation means for determining a phase shift between the output signals from the encoder.

3. The signal analysis system of claim 2, wherein said error compensation means corrects for output signals which are non-quadrature.

4. The signal analysis system of claim 1, wherein said low-resolution stage is an electrical circuit comprising said low-resolution analog-to-digital converter.

5. The signal analysis system of claim 4, wherein said low-resolution analog-to-digital converter is a comparator.

6. The signal analysis system of claim 5, wherein said comparator is a Schmitt comparator.

7. The signal analysis system of claim 1, wherein said counter is a square-pulse counter.

8. The signal analysis system of claim 7, wherein said square-pulse counter is a quadrature up/down counter.

9. The signal analysis system of claim 1, further including an amplifying/filtering circuit for amplifying and filtering the output signals from the encoder.

10. The signal analysis system of claim 9, wherein said amplifying/filtering circuit comprises amplifying and filtering stages including, respectively, at least two amplifiers and at least two capacitors.

11. A method for processing a pair of analog signals from an encoder to determine a position of the encoder, comprising:

receiving the analog signals;

separating the analog signals into first and second portions;

digitizing the first and second portions of the analog signals with the hardware component to form, respectively, digital square and sinusoidal waveforms representative of the analog signals;

processing the digital square and sinusoidal waveforms with a computational component to determine a total phase value of the analog signal; and, calculating the position of the encoder from the total phase value.

12. The method of claim 11, wherein said processing includes:

calculating a first phase value from the digital square waveform;

calculating a second phase value from the digital sinusoidal waveforms; and, adding the first and second phase values to determine the total phase value of the analog signal.

13. The method of claim 12, wherein calculating the first phase value comprises:

counting an integer value of square pulses from the digital square waveform with the hardware component; and, multiplying the integer value by a constant value to determine the first phase value.

14. The method of claim 13, wherein the constant value is $\pi$.

15. The method of claim 12, wherein calculating the second phase value comprises determining a phase of a final period of one of the digital sinusoidal waveforms.

16. The method of claim 15, wherein the analog signals are a pair of quadrature or near-quadrature analog signals, and the digital sinusoidal signal is a pair of digitized quadrature or near-quadrature signals.

17. The method of claim 16, wherein determining the phase of the final period of one of the digital sinusoidal waveforms comprises using the equation:

$$\text{phase} = 2\pi C + \text{phase}(X, Y)$$

where C is proportional to the number of square pulses in the digital waveform and phase(X,Y) is the arctan of (Y/X) where:

$$X = \left[A\cos\left(\frac{\delta}{2}\right) - B\sin\left(\frac{\delta}{2}\right)\right]\cos(\delta)$$

$$Y = \left[B\cos\left(\frac{\delta}{2}\right) - A\sin\left(\frac{\delta}{2}\right)\right]\cos(\delta)$$

and $$A = \cos(\theta' - \delta/2)$$

$$B = \sin(\theta' + \delta/2)$$

where $\delta$ is the phase difference between the two analog signals and $\Theta'$ is the phase of a final period of one of the digital sinusoidal waveforms.

* * * * *